US005514841A

United States Patent [19]

Rochon

[11] Patent Number: 5,514,841

[45] Date of Patent: May 7, 1996

[54] REFLEX COMPRESSION VALVE - DIVIDED CHAMBER LOUDSPEAKER CABINET

[76] Inventor: Donald C. Rochon, Suite G-77; 13315-104th Avenue, Surry, British Columbia, Canada, V3T 1V5

[21] Appl. No.: 220,444

[22] Filed: Mar. 30, 1994

[51] Int. Cl.[6] .................... H05K 5/00

[52] U.S. Cl. .................... 181/156; 181/145; 181/146; 181/199

[58] Field of Search .................... 181/144, 145, 181/146, 147, 148, 151, 152, 156, 199

[56] References Cited

U.S. PATENT DOCUMENTS

| | | | |
|---|---|---|---|
| 3,165,587 | 1/1965 | Alderson | 181/144 |
| 4,031,318 | 6/1977 | Pitre | 181/144 |
| 4,618,025 | 10/1986 | Sherman | 181/148 |
| 4,635,748 | 1/1987 | Paulson | 181/145 |
| 4,714,133 | 12/1987 | Skaggs, Jr. | 181/148 X |
| 5,012,889 | 5/1991 | Rodgers | 181/152 |
| 5,123,500 | 6/1992 | Malhoit et al. | 181/144 |
| 5,324,896 | 6/1994 | Magnani | 181/144 |

*Primary Examiner*—Khanh Dang
*Attorney, Agent, or Firm*—Michael I. Kroll

[57] ABSTRACT

The present invention relates to a reflex compression valve—divided chamber speaker cabinet which improves acoustic frequencies emanating from the speaker cabinet by specially designed and positioned ports located frontally and rearwardly within the speaker cabinet. The speaker cabinet greatly reduces reverb or lag caused by uncontrolled reflecting air within a standard baffle chamber resulting from the speaker cabinet design and electrical passive crossover network.

13 Claims, 2 Drawing Sheets

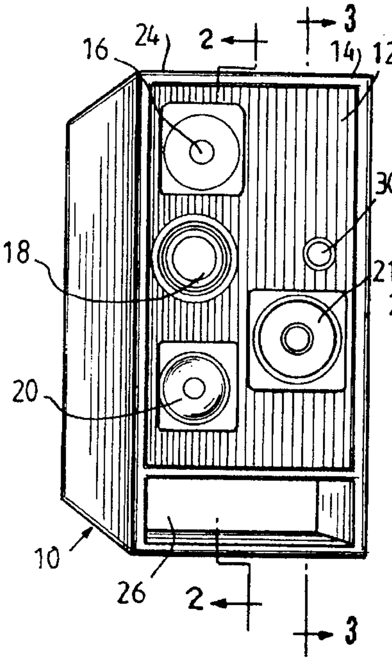
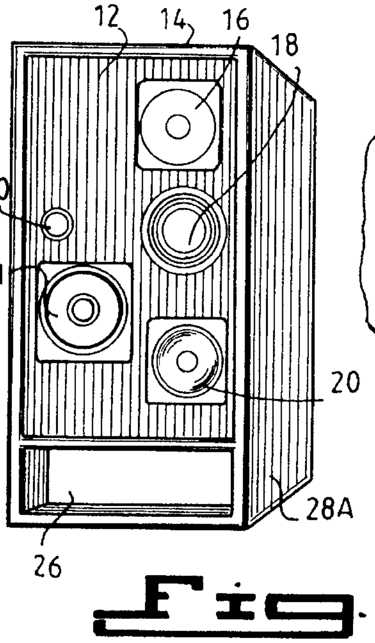
Fig. 1b
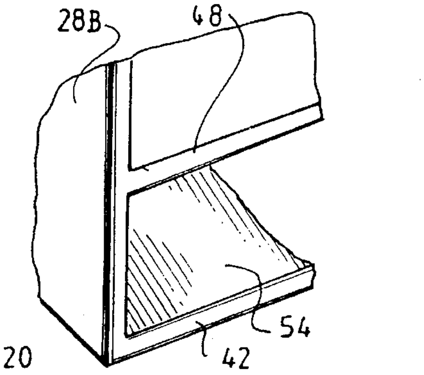
Fig. 1c
Fig. 1a
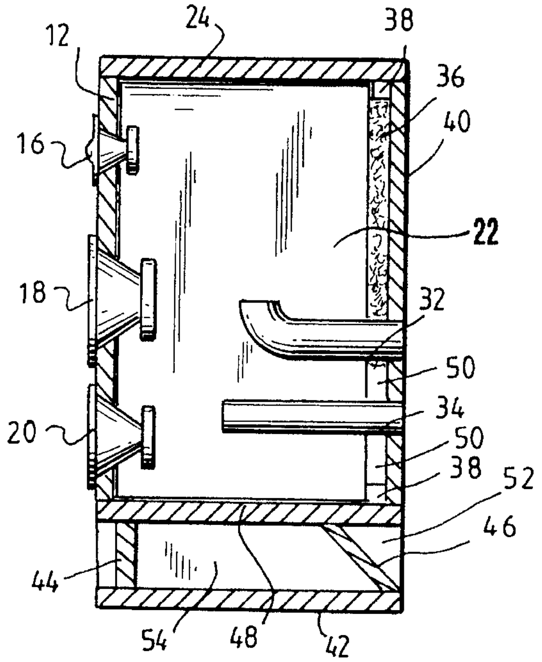
Fig. 2
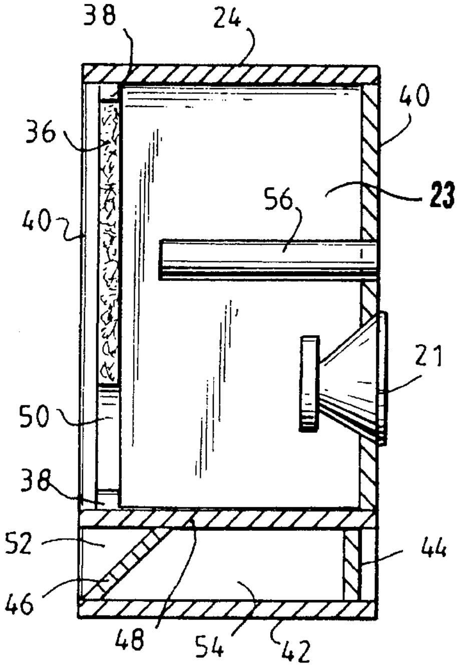
Fig. 3

REFLEX COMPRESSION VALVE - DIVIDED CHAMBER LOUDSPEAKER CABINET

BACKGROUND OF THE INVENTION

1. Field of the Invention

The present invention relates to improvements in ducting for acoustical speakers and enclosures.

The invention relates generally to loudspeaker enclosures utilized for sound reproduction and particularly to a method and apparatus for more fully utilizing existing driver cone radiated energy for improvement of efficiency and quality of sound.

This invention relates, generally, to speaker cabinets, and more particularly relates to speaker cabinets of the type having more than one speaker positioned therein and being provided with means that allow the sounds emanating from the speakers to mix prior to discharge of the sound by a horn member.

2. Description of the Prior Art

A bass loudspeaker, or woofer, radiates sound both in the forward and rearward directions. One of the purposes of a speaker enclosure is to prevent the cancellation effect of the rear wave of the woofer upon the waves radiated from the front by isolating the forward wave from the rearward wave. Several kinds of enclosures are known in the art:

(a) Infinite Baffle (Air Suspension): An air suspension enclosure is a completely sealed box in which the rear wave is prevented from cancelling the front wave.

(b) Bass Reflex: The bass reflex design utilizes a portion of the rear wave of the woofer to augment the front wave.

(c) Horn Enclosure: In this design, a horn acts as an acoustical transformer that matches the high mechanical impedance of the vibrating diaphragm to the relatively low acoustical impedance of the air at the large mouth of the horn.

(d) Acoustical Labyrinth: This design channels the rear wave from the woofer through a folded passageway so that when the sound finally emerges it is delayed as much as possible and, therefore, reinforces the woofer at the lowest possible frequency.

The use of quality sound systems in both the home and in businesses are often times limited by the size limitations on the speaker enclosures and hence, there has been considerable effort to achieve big sound while utilizing a small enclosure. Various types of ducting has been accomplished in connection with the speaker enclosures in an attempt to effectively extend the frequency response curve at the low end.

Since low frequency response is largely dependent on the loud speaker system resonance, current designs usually rely on an enclosure that is proportionally large in relation to the driver. Stated another way, the larger the enclosure, the lower the frequency resonance. The driver, or any other moving piston in connecting with the enclosure represents an enclosure opening. The smaller the enclosure opening is, again the lower the resonance is. Therefore, reducing the enclosure size means reducing the driver size as well if low frequency performance is to be maintained.

However, in the case of small enclosures, the driver size must be too small to be an efficient radiator if low frequency performance is the objective. Also, power handling ability is decreased with the use of small drivers. Therefore, it is a practice of most small loud speaker system designs to use a larger driver in order to keep efficiency reasonable, trading low frequency performance as a result of the larger effective enclosure openings.

Increasing the mass of a larger speaker in order to obtain lower frequency response has been accomplished by adding a papier mache weight to the center of the speaker cone on a conventional speaker so that speaker may be used in a smaller enclosure. The addition of weight lowers the resonance of the speaker so that when it is coupled to an enclosure the added mass to the loud speaker diaphragm will help to lower the overall resonance of the loud speaker and enclosure together. Although the added weight lowers the resonance of the loud speaker, its ability to reproduce higher frequencies has been traded for the lower resonance.

Often times additional openings will be provided in the enclosure and are connected to ducting within the enclosure in order to tune the overall resonance of the system while allowing the energy from the rear of the loud speaker cone to be added to the front wave which has met with reasonable success.

Another conventional device to further tune the enclosure is by the addition of a passive radiator which serves to transfer sound into the surrounding outside area.

Another problem associated with the use of large speaker assemblies or passive radiators for that matter, is the tendency for these large diaphragms to continue ringing after the electrical signal has been terminated from the driver.

Conventional drivers are mounted in loudspeaker enclosures with the face of the enclosure being utilized as the radiator while the remainder of the enclosure being utilized as the radiator while the remainder of the enclosure is used as a sound or acoustic energy absorption device. In structures of this nature the driver is physically attached to the face plate and the enclosure has walls formed of non-resonant material with a high sound absorption coefficient, the walls of such enclosures being of a relatively high mass and thickness in order to facilitate maximum sound absorption. In addition, these enclosures are usually filled or stuffed with sound absorbent material such as cotton, fiberglass, etc. Such conventional speaker structure intends the radiation of the principal sound from the front of the enclosure and provides for the reduction or control of sounds which emanate from the rear of the driver cone since sounds emanating from the back side of the cone are essentially 190 degrees out of phase with the forward sound and would effectively cancel the forward sound an would effectively cancel the forward sound wave if the two were permitted to co-mingle. This 180 degrees out of phase sound pressure wave is normally referred to as the back wave and, in addition to possessing high orders of audio energy that must be controlled, reacts within the interior of the loudspeaker enclosure (which in reality is a chamber or series of chambers) to create standing waves of high energy sound plus a counterforce of nodes or low energy areas. In addition, any structural material in the vicinity is invaded through the molecular framework of the material by the primary frequencies of the front and back waves plus all of the supporting harmonics thereof, the totality of which creates vibration resonances commensurate with the mass, tension and composition of the material utilized in the enclosure structure.

A profusion of resonances is thus activated by the driver from the driver chamber or chambers, sides, top bottom, back, etc., it being necessary to bring all of these resonances under some semblance of control if the audio reproduction is to be properly presented.

Control of enclosure oriented sound energy has been directly related to the ability to engage and rapidly convert these waves of pressure energy to other forms of energy. The frequency range of audio sound is such that the most practicable means, and hence, the basic control method that has previously emerged, is the conversion of kinetic pressure energy into heat energy. This conversion process involves insertion of materials with very high fiber count into the pathway of the audio wave. In attempting to penetrate the material, the audio wave will cause the individual fibers of the material to vibrate, thus absorbing and converting the audio energy into heat energy. Materials possessing a very high fiber count, such as cotton, fiberglass, particle board and the like are commonly used. Unfortunately, the efficiency of high fiber count material is quite low and no material has yet surfaced which can effectively absorb and dissipate audio frequencies of the size typically used for loudspeakers in sound reproduction systems. Within the state of the art, high degrees of sound absorption can only be realized by developing anechoic conditions. However, the attainment of anechoic conditions requires the use of expensive materials, specialized construction techniques and air volumes of excessively large proportions, all of which tend to make the anechoic application impractical for typical loudspeaker enclosures.

Accordingly, prior practices in the art have only been able to contain the diverse resonances and undesirable sounds within and emanating from loudspeaker enclosures to that level of efficiency and effectiveness constrained by the commonly available high fiber count materials. These materials have of necessity been used regardless of unfavorable mass and weight considerations and even with the recognition that the materials cannot differentiate between desirable and undesirable audio sounds. In spite of the shortcomings attendant to the prior practices thus enumerated, two predominant designs of loudspeaker enclosures have previously emerged and are almost exclusively constitute conventional practice, these designs being describable as the sealed enclosure, better known as the "infinite baffle,"and the ported box enclosure, most commonly referred to as the "bass reflex."

In the infinite baffle design, the backwave is sealed within the enclosure. The concept involves the use of all solid wall, thereby resulting in the rear wave being prevented from engaging the front wave. Further, high fiber construction material is used to stuff the interior of the enclosure, the high fiber count suppressing the many resonances and unwanted enclosure sounds. In practice, the practical size of a sealed enclosure is severely limited in comparison to the length of the sound waves encountered.

Now referring to the prior art, the patent to Pitre, U.S. Pat. NO. 4,031,318, issued Jun. 21, 1977 for "High Fidelity Loudspeaker Systems"shows ducting surrounding the speaker but does not reduce the effective area of the opening.

SPEAKER ENCLOSURE

Howard Rodgers

U.S. Pat. No. 5,012,889

A loudspeaker enclosure accommodates at least one speaker in the front wall of the enclosure. The interior of the enclosure is divided into two smaller chambers by means of a partition inclined with respect to the front and rear walls. One such chamber is adjacent to the speaker, while the second or rear chamber is separated from the front chamber by the partition. Below the speaker is a vent or port in communication with the rear chamber. Sound waves emanating from the rear of the speaker are reflected by the inclined partition and reflected upwardly toward the top of the speaker enclosure. The partition does not extend to the top wall of the enclosure, thereby allowing sound waves to reflect off of the top wall and enter the rear chamber. The sound waves then exit the enclosure through the port below the speaker. The rear waves are thus delayed with respect to the front waves from the speaker to achieve the desired tuning of the speaker system. Furthermore, the arrangement of the interior partition causes the rear waves to be compressed at two location thereby increasing the effective delay and further improving low frequency response.

SPEAKER CABINET HAVING

INTERACTIVE SPEAKERS

Rollie W. Paulson

U.S. Pat. No. 4,635,748

A speaker cabinet of the type used in stereo systems. A horizontal wall partitions the interior of the cabinet into an upper portion within which is positioned a full range speaker member, and a lower portion within which is positioned a low range speaker member. A pair of laterally spaced ports are formed in the partition wall to allow sound emanating from the low range speaker to enter into the upper portion of the cabinet. A horn associated with the full range speaker is spaced apart therefrom, in non-attached relation thereto to define a space between the full range speaker and the horn. Sound from the low range speaker and from the full range speaker enters into the space between the full range speaker and the horn and mixes so that the sound emanating from the horn is a full bodied sound characterized by minimal distortion and substantial absence of unpleasing sounds of the type associated with speakers of the prior art.

METHOD AND APPARATUS FOR AUGMENTATION OF SOUND BY ENHANCED RESONANCE

John E. Skaggs, Jr.

U.S. Pat. No. 4,714,133

The invention presents a method for improving overall efficiency and quality in sound reproduction systems by providing a system which establishes positive phase control over the many and varied resonant characteristics encountered in the reproduction and presentation of audio energy. The apparatus embodying the present method primarily consists of speaker structures within which drivers such as conventional cone drivers are acoustically coupled to both air and to the materials from which the enclosure of the speaker structure is formed by optimizing existing atmospheric pressure differentials and induced audio vibration readily available within these structures. The coupling is obtained through the use of acoustical resonator structure placed within a speaker enclosure an through particular distribution of mass in the enclosure and the materials.

ACOUSTICAL DUCTING FOR SPEAKERS AND ENCLOSURES

Dan R. Sherman

U.S. Pat. No. 4,618,025

In an acoustical speaker having a movable diaphragm responsive over a range of frequencies, an air duct having a cross-sectional area less than that of the diaphragm substantially surrounding the diaphragm and in communication with one side thereof for acoustically isolating the diaphragm, dampening low-frequency ringing and acoustically loading the diaphragm for extending the frequency range to lower frequencies to enhance the performance of the speaker with small speaker enclosures. One embodiment provides for similar ducting for passive radiator diaphragms.

Numerous innovations for speaker cabinets have been provided in the prior art that are adapted to be used. Even though these innovations may be suitable for the specific individual purposes to which they address, they would not be suitable for the purposes of the present invention as heretofore described.

SUMMARY OF THE INVENTION

Accordingly, it is an object of the present invention to provide a speaker cabinet.

More particularly, it is an object of the present invention to provide a speaker cabinet having at least one division and at least one port opening or baffle on each side of the divider.

It is therefore clear that the primary object of the invention is to advance the art of speaker cabinet design in a radical, pioneering way.

A more specific object is to pioneer the art of speaker systems having a port member spaced apart form one of at least one speaker member so that sound from said speaker or plurality of speakers can mix before entering a port.

Another object is to provide a speaker system that separates a full range speaker system from a low range speaker system by a partition having one or more openings formed therein to permit sound mixing.

The invention primarily provides a speaker cabinet for utilizing that portion of the many resonances, and other acoustic energy sources available within loudspeaker enclosures, currently being used to provide higher efficiencies and quality improvement in sound reproduction. The particular speaker structures of the invention set to place under positive control the backwave which emanates from a conventional cone driver, the present structure acting further to acoustically couple within the same operating chamber one or more cone drivers or similar drivers to both the air and to the materials from which the enclosure of the speaker is formed. The structure of the present speaker cabinet also acts to control acoustical interference created by resonances, standing waves, nodes, and other nuances within the enclosure itself. The nature of the present speaker cabinet allows additional advantages such as simplicity of design and construction not constrained by size, weight or material. The present speaker cabinet thereby provides high efficiencies and superior sound reproduction through the placement of acoustical resonator structure, port, within the enclosure per se.

Accordingly, it is a primary objective of the invention to provide speaker structure and particularly speaker enclosure structure which places under positive control the backwave emanating from the driver cone.

Another object of the present invention is to provide a speaker enclosure which substantially eliminates acoustical interference created by resonances, standing waves and nodes within the enclosure itself.

A further object of the invention is to provide speaker enclosure of simple design which can be formed of varying materials including thin walled materials, the enclosures themselves being of a reasonable size and weight relative to the quality of sound produced.

In the case of an active speaker diaphragm, the ducting substantially surrounds the rear surface of the diaphragm and provides a restricted air passageway between the rear surface of the diaphragm and the interior of the enclosure. This ducting between the diaphragm and the enclosure serves to effectively reduce the area of the opening occupied by the driver. The amount of area reduction naturally depends on the size of the duct but because the enclosure opening can be effectively reduced in area, enclosure opening can be effectively reduced in area, enclosure resonance remains low thereby enabling the system to respond at low frequencies in the region of the resonance. Whereas the use of the duct, port, somewhat reduces efficiency, use of the larger driver more than offsets this reduction in efficiency and the net result is higher efficiency for the same enclosure size.

The present invention provides for acoustical ducting to be operably connected to the vibrating diaphragms themselves, whether they be active or passive, as opposed to simple ducting within the speaker enclosure itself. The present invention provides ducting, ports, to make possible low frequency response from a loud speaker system having an enclosure that is smaller, in proportion to the moving speaker elements, than the enclosures used in conventional designs, all without serious tradeoffs of desirable for undesirable characteristics.

Other advantages of using the ducting in this manner also become apparent. Air that is moved by the rear of the loud speaker cone or diaphragm is forced to move through this restrictive ducting, port, which, because of the reduced area, serves to restrict the air flow and thus, dampens the movement of the loud speaker cone to prevent ringing after the electric signal is terminated.

Further, since a specific air mass is enclosed within the volume of the duct, the air mass has a specific resonance. This air mass serves to couple to the mass of the diaphragm which, at low frequencies, tends to have the effect of adding mass to the driver to lower the resonance of the driver. However, since the air is somewhat springy, high frequency performance is substantially unaffected.

The novel features which are considered characteristic for the invention are set forth in particular in the appended claims. The invention itself, however, both as to its construction and its method of operation, together with additional objects and advantages thereof, will be best understood from the following description of the specific embodiments when read in connection with the accompanying drawing.

BRIEF DESCRIPTION OF THE DRAWING

FIG. 1 *a* is a front view of the left speaker cabinet exhibiting low, high and mid-frequency speaker systems, and ports;

FIG. 1*b* is a front view of the right speaker cabinet exhibiting low, high and mid-frequency speaker systems, and ports;

FIG. 1 *c* is a front perspective view of the lower port;

FIG. 2 is a cross-sectional view taken along line 2—2 of figure 1 *a*;

FIG. 3 is a cross-sectional view taken along line 3—3 of FIGURE 1 *a*;

Figure 4:
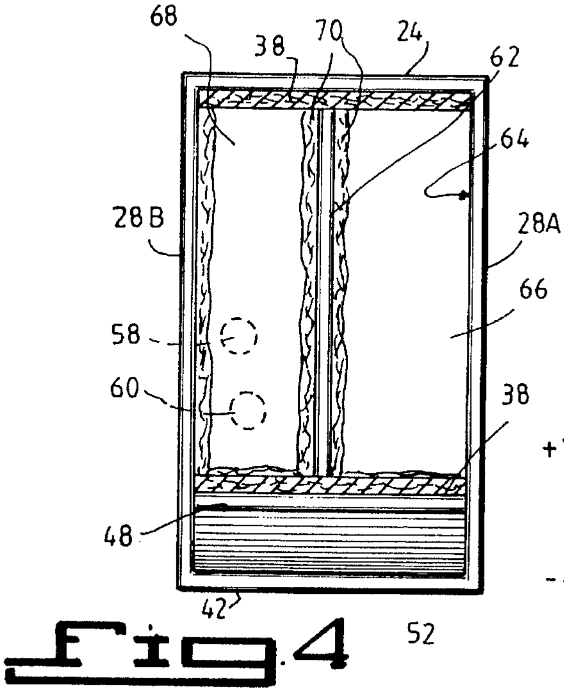
FIG. 4 is a rear view of the speaker cabinet exhibiting a lower divider with fibrous batting material and rearwardly facing port openings.

LIST OF REFERENCE NUMERALS UTILIZED IN THE DRAWING 10 reflex compression valve divided chamber speaker cabinet
12 front cabinet panel
14 front cabinet panel frame
16 tweeter
18 mid range
20 mid woofer
21 woofer
22 air compression within cabinet
23 decompressed air
24 cabinet top
25 insulated air space
28A cabinet right side panel
28B cabinet left side panel
30 front port
32 L-shaped air velocity normalizing port
34 main tuned base port
36 polyester batting
38 batten spacing
40 rear cabinet panel
42 bottom cabinet panel
44 recessed front plane
46 angled recessed rear plane
48 bottom acoustic chamber panel
50 internal air space
52 angled air space between cabinet walls
54 insulated air space
56 crossover
58 velocity normal rear port
60 tuned rear bass port
62 chamber divider
64 interior base reflecting surface
66 woofer side of divided chamber
68 tweeter, mid range and mid-woofer side of divided cabinet
70 inside chamber insulation
72 simplified representation of "compression lag"
72A reverb (lag)
72B primary signal (positive half)
74 capacitor
76 inductor
78 input
80 tweeter output
82 mid range output
84 woofer output
86 mid-woofer output

DETAILED DESCRIPTION OF THE PREFERRED EMBODIMENT

Now referring to FIGS. 1*a*, 1*b*, and 1*c*, the reflex compression valve divided chamber speaker cabinet 10 is composed of a front panel 12 fastened by a front panel frame 14, a right panel 28A, a left panel 28B, a cabinet top 24, a rear cabinet panel 40, and a bottom panel 42. The speaker system operates on the principle of controlling both compressed 22 and de-compressed 23 air flow within the ported speaker baffle chamber by means of a chamber divider 62 and controlling air flow past the divider 62 with layers of polyester batting 36 and 70 to form a valve combined with a "tuned"free flow air past slot 26.

At least one woofer a secondary speaker system which is affixed to the front panel of the cabinet is shown. The woofer is affixed to the front panel of the cabinet, the secondary speaker system is located on the opposite half of the dual divided speaker cabinet.

Figure 5:
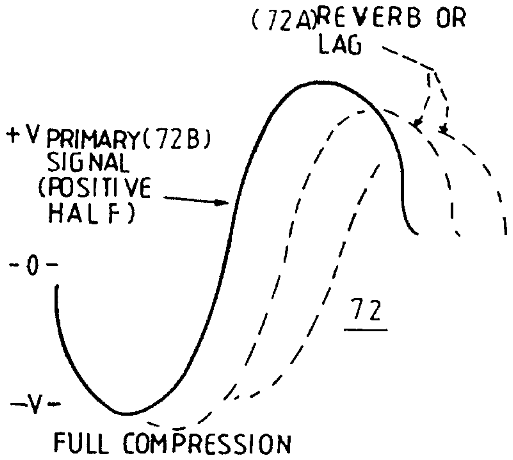
FIG. 5 is a perspective view of a sound wave exhibiting a primary signal and two reverb or lag waves during full compression.

Referring to FIGS. 2,3, and 5 air compression 22 within the chamber (resulting from the inward movement of the woofer 21 compresses the light density polyester batting 36 at the rear cabinet panel 40 allowing the compressed air to flow past the entire length of the divider from the woofer side 66 to the smaller tweeter, mid-range, and mid-woofer side 68 and flow out of the velocity normal rear port 58 and tuned rear base port some compressed air 22 also flows out of the front port 30 which is semi-choked. The front port 30 is tuned to the lowest frequency 72B in base response to the woofer 21. The front port 30 reduces the volume and velocity of air flow which minimizes reverb(lag) 72A.

Referring to FIG. 4, air de-compression 23 within the woofer chamber 66, caused by forward movement of woofer cone 21 results in the rear polyester batting 36 closing toward divider end 62 which is held in place by batten splicing 38 at the rear wall 40 of the chamber reducing the compressed air 22 flow past the entire length of the chamber divider 62. Some compressed air 22 also flows out of the front port 30. The divided chambers 66 and 68 are maintained as a whole chamber by a tuned free flow air pass slot 50. At the point of full de-compression of air within the chamber, the batting 36 valve is closed against the end of the divider 62 to prevent the woofer from "ringing".

The main rear bass port 34 is tuned to the chamber air volume in relation to the woofer response which refers to optimum bass frequency of a particular woofer. The front port 30 is "down"tuned to the lowest available frequency of the "fold"created by the divider and batting valve. The L-shaped air velocity normalizing port 32 does not directly produce base through itself. Only the two straight tubular ports produce base frequency response. The L-shaped air velocity normalizing port 32 does however tune the base ports by reducing the increased velocity on the compression stroke of the woofer 21 which is increased velocity caused by the valve. The L-shaped port's 32 main function is therefore unique to the present invention and is essential to maintain time alignment and symmetrical base envelope tuning for the main rear port 34.

The lower plane consists of a recessed front plane 44 and an angled recessed rear plane 46 which provides an angled air space 52 and insulated air space 54, hence, an air pocket cushion is formed to reduce fold back of bass waves occurring on the speaker mounting front panel 12.

Regarding the speaker placement, the woofer 21 is off-set providing reduced outside air disturbance in relation to a vertical central axis which is an imaginary line of the mid-woofer 20, mid-range 18 and tweeter 16. Thus, audibly reducing frequency masking particularly in the higher frequency ranges. A high quality 4-way passive roll-off crossover 56 network assists in improved clarity of the entire speaker system. The mid-woofer 20 and mid-range 18 vertical center alignment provides a proper frequency phase relationship which is very important for singing voices and broad range musical instruments such as piano, organ, saxophone etc. as well as various musical instruments playing together.

The crossover is 12 db roll-off. Additionally, the secondary speaker system contains a woofer handling 10–500 Hz and the primary speaker system contains a mid-woofer with a narrow band pass of 55–800 Hz. The primary and secondary speaker systems are positive throw polarity, hence positive wire terminal causes forward core motion with an electric signal.

Figure 6:
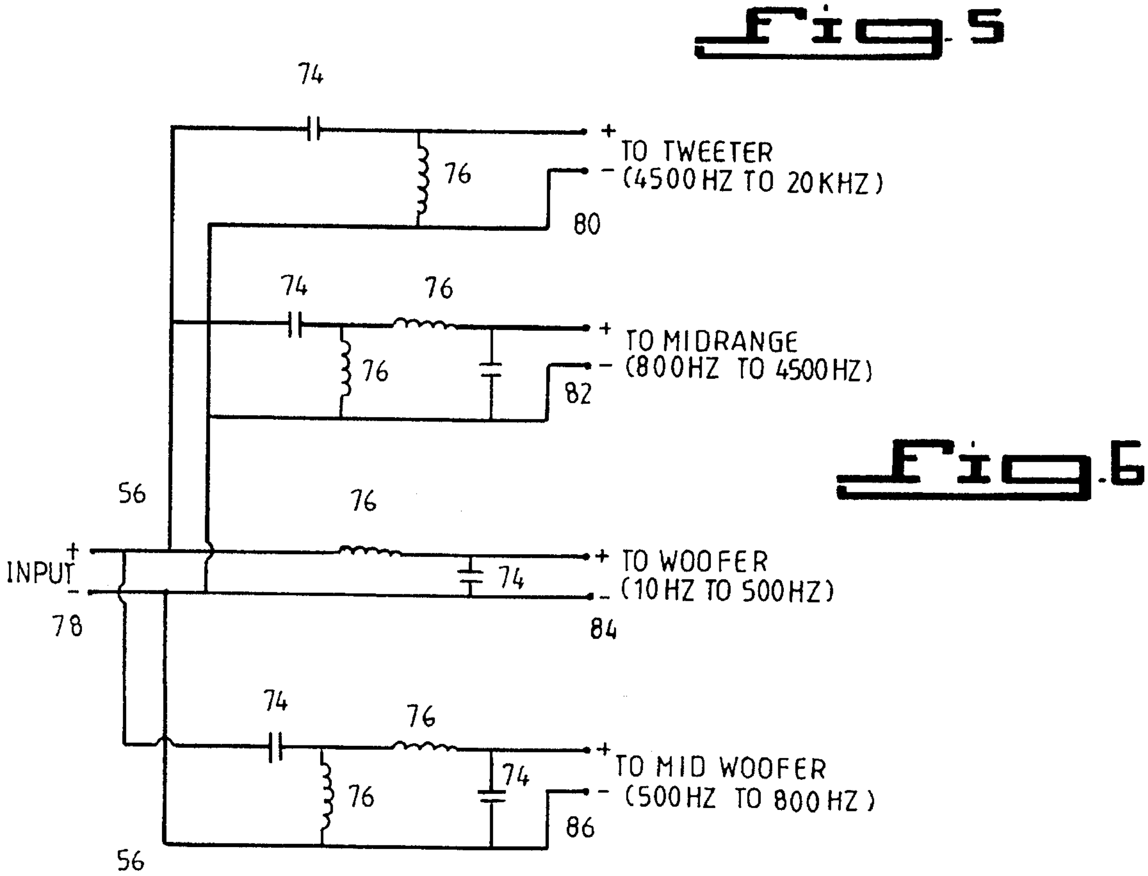
FIG. 6 is an electrical diagram exhibiting a schematic of the crossover of the speakers contained within the cabinet.

Referring to FIG. 6, the four speaker drivers; tweeter 80, mid-range 82, woofer 84 and mid-woofer 86 all contain an inductor 76 and capacitor 74 with a common input 78. The speaker drivers are all positive throw polarity (i.e. positive wire terminal causes forward cone movement and sound reflects off the interior base reflecting surface 64 resulting in forward cone motion with an electrical signal resulting in a simplified representation of compression lag 72.

Front and rear port tuning is accomplished by adjusting the length of the port tube (i.e. the longer the tube at a given diameter, the lower the frequency tuning). The speaker cabinet design accommodates true dual bass tuning. The semi-choked port 30 is a port tube which has its internal end opening in close proximity to the rear cabinet wall 40 containing batting 36.

The port has an internal opening in proximity within 6 inches from said rear cabinet wall which is dampened with said batting. The speaker cabinet is 21 inches in height, 13 inches in width, and 11⅞ in depth. Additionally the speaker cabinet has an acoustically permeable front speaker protective cover.

It will be understood that each of the elements described above, or two or more together, may also find a useful application in other types of constructions differing from the type described above.

While the invention has been illustrated and described as embodied in a speaker cabinet, it is not intended to be limited to the details shown, since it will be understood that various omissions, modifications, substitutions and changes in the forms and details of the device illustrated and in its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

I claim:

1. A reflex compression dual valve divided chamber speaker cabinet, said dual valve divided chamber speaker cabinet having a first half and a second half and comprising:

a) a front panel;

b) a rear panel;

c) a bottom surface;

d) a divider for dividing said first half and said second half of said dual valve divided chamber speaker cabinet;

e) a primary speaker system selected from the group consisting of a tweeter, mid-range and mid-woofer, said primary speaker system being affixed to said front panel of said dual valve divided chamber speaker cabinet, said primary speaker system being located on said first half of said dual valve divided chamber speaker cabinet;

f) a secondary speaker system;

g) a woofer of said secondary speaker system affixed to said front panel of said dual valve divided chamber speaker cabinet, said secondary speaker system being located on said second half of said dual valve divided chamber speaker cabinet;

h) at least one port located on said front panel of said dual valve divided chamber speaker cabinet;

i) a plurality of ports located on said rear panel of said dual valve divided chamber speaker cabinet with at least one of said plurality of ports being L-shaped for increasing tuning of said dual valve divided chamber speaker cabinet;

j) a front lower surface located at said bottom surface of said dual valve divided chamber speaker cabinet having an angled side for providing an air pocket cushion for reducing fold back of bass waves;

k) an internal air space located between said first half and said second half of said dual valve divided chamber speaker cabinet for reducing distortion factors to said secondary speaker system containing said woofer and for improving clarity of said primary speaker system; and, l) a high quality passive roll-off cross over network connecting both said primary speaker system and said secondary speaker system.

2. A reflex compression valve divided chamber speaker cabinet as described in claim 1, wherein said dual valve divided chamber speaker cabinet contains an internal layer of polyester batting to form a valve.

3. A reflex compression valve divided chamber speaker cabinet as described in claim 2, wherein said polyester batting is of low density and light weight.

4. A reflex compression valve divided chamber speaker cabinet as described in claim 1, wherein said front port is semi-choked to reduce air flow.

5. A reflex compression valve divided chamber speaker cabinet as described in claim 4, wherein a front panel port tuning is accomplished by length adjusting.

6. A reflex compression valve divided chamber speaker cabinet as described in claim 4, wherein a rear panel port tuning is accomplished by length adjusting.

7. A reflex compression valve divided chamber speaker cabinet as described in claim 4, wherein said front port is down tuned to a lowest possible frequency of a fold created by said divider and a batting valve.

8. A reflex compression valve divided chamber speaker cabinet as described in claim 1, wherein said dual valve divided chamber speaker cabinet is sealed in its entirety with a batting functioning to damper vibration for said dual valve divided chamber speaker cabinet.

9. A reflex compression valve divided chamber speaker cabinet as described in claim 1, wherein placement of said secondary speaker is off-set providing reduced outside air disturbance in relation to an imaginary vertical central axis of said primary speaker system which audibly reduces frequency masking particularly in higher frequency ranges.

10. A reflex compression valve divided chamber speaker cabinet as described in claim 1, wherein said crossover network is four-way crossover network.

11. A reflex compression valve divided chamber speaker cabinet as described in claim 1, wherein said speaker cabinet is manufactured from composites selected from the group consisting of fiberglass, plastic, epoxy, metal, metal alloys, wood and a combination thereof.

12. A reflex compression valve divided chamber speaker cabinet as described in claim 11, wherein said dual valve divided chamber speaker cabinet is 21 inches in height, 13 inches in width and 11⅞ inches in depth.

13. A reflex compression valve divided chamber speaker cabinet as described in claim 12, wherein said dual valve divided chamber speaker cabinet has an acoustically permeable front speaker protective cover over said front panel.

* * * * *